US006313619B1

(12) United States Patent
Roth

(10) Patent No.: US 6,313,619 B1
(45) Date of Patent: Nov. 6, 2001

(54) ARRANGEMENT FOR MEASUREMENT OF PHASE NOISE OF A TEST SPECIMEN

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/477,408

(22) Filed: Jan. 4, 2000

(30) Foreign Application Priority Data

Jan. 18, 1999 (DE) .............................................. 199 01 750

(51) Int. Cl.[7] .......................................................... G01R 1/08
(52) U.S. Cl. .......................................... 324/76.19; 324/601
(58) Field of Search .................................... 324/613, 601, 324/76.19, 612; 331/11

(56) References Cited

U.S. PATENT DOCUMENTS 4,272,719 * 6/1981 Niki ....................................... 324/612
4,714,873 * 12/1987 McPherson ............................ 324/613
4,780,667 * 10/1988 Reese .................................. 324/76.79
5,059,927 * 10/1991 Cohen .................................... 331/11

OTHER PUBLICATIONS

Ulrich Rohde, "Microwave and Wireless Synthesizers," Chapter 2.8.2 and Chapter 2.8.5, pp. 118–132; 1997.

* cited by examiner

Primary Examiner—Vinh P. Nguyen
Assistant Examiner—Trung Q. Nguyen

(57) ABSTRACT

To measure phase noise of an output signal of a test specimen with a spectrum analyzer whose measuring branch comprises a plurality of serially-connected heterodyne stages, a compensation generator is provided which comprises a plurality of heterodyne stages arranged serially-connected in reverse order to that of the heterodyne stages of the measuring branch and which has an input oscillator which corresponds to a last intermediate frequency of the measuring branch; the output signal of this compensation generator being added to an output signal of the test specimen, having an approximate equal-value level and being approximately oppositely phased thereto, in an adder stage which is connected serially to the measuring branch.

4 Claims, 1 Drawing Sheet

ARRANGEMENT FOR MEASUREMENT OF PHASE NOISE OF A TEST SPECIMEN

BACKGROUND OF THE INVENTION

This invention relates to an arrangement for the measurement of phase noise of a test specimen according to the preamble of the independent claim.

In phase noise measurement of signals of a test specimen using a spectrum analyzer, phase noise of mixing oscillators of the spectrum analyzer is added to phase noise of the test specimen. Test specimens, therefore, can only be correctly measured if their signal-to-noise ratios are at least 5 dB worse than for the spectrum analyzer (Ulrich Rohde, "Microwave and Wireless Synthesizers," Chapter 2.8.2).

To avoid this disadvantage, it is known to construct two identical test specimens and to mix these in a mixer at 0 Hz (Ulrich Rohde, Chapter 2.8.5). Using this process, the actual carrier of the test specimen disappears and then only noise sidebands are measured, the phase noise of the spectrum analyzer itself not being included. A disadvantage of this known process is that two identical test specimens must be present.

To suppress a carrier it is also known to use specialized so-called notch filters, which however must be of high quality.

It is an object of this invention to provide a structurally uncomplicated arrangement with which phase noise can be measured with a spectrum analyzer even of test specimens which, compared with noise characteristics of the spectrum analyzer, have relatively good noise characteristics.

SUMMARY OF THE INVENTION

This object is met for an arrangement as set forth in the preamble of the principal claim, by the characterizing claimed features thereof. Advantageous enhancements are set forth in the dependent claims.

According to principles of this invention, a carrier of the test specimen is strongly suppressed, up to a predetermined small carrier remainder, by addition of an output signal of the test specimen to an output signal of a compensation generator, which is constructed in the manner of a tracking generator, without hereby affecting sideband noise. In this manner, a good oscillator, with respect to noise, can be precisely measured using a relatively poor spectrum analyzer. Creation of the output signal of the compensation generator is accomplished in a very uncomplicated and economical manner, as is known for so-called tracking generators. An equal-value but oppositely phased compensation signal used for suppression of the carrier does not itself contribute to phase noise; only phase noise of an additional input oscillator of the compensation generator has an effect. However, due to the low frequency, this input oscillator can be constructed with low noise without great expense.

BRIEF DESCRIPTION OF THE DRAWING

The invention is described in more detail below using an example embodiment shown in the schematic drawing.

DETAIL DESCRIPTION OF THE INVENTION

Figure 1:
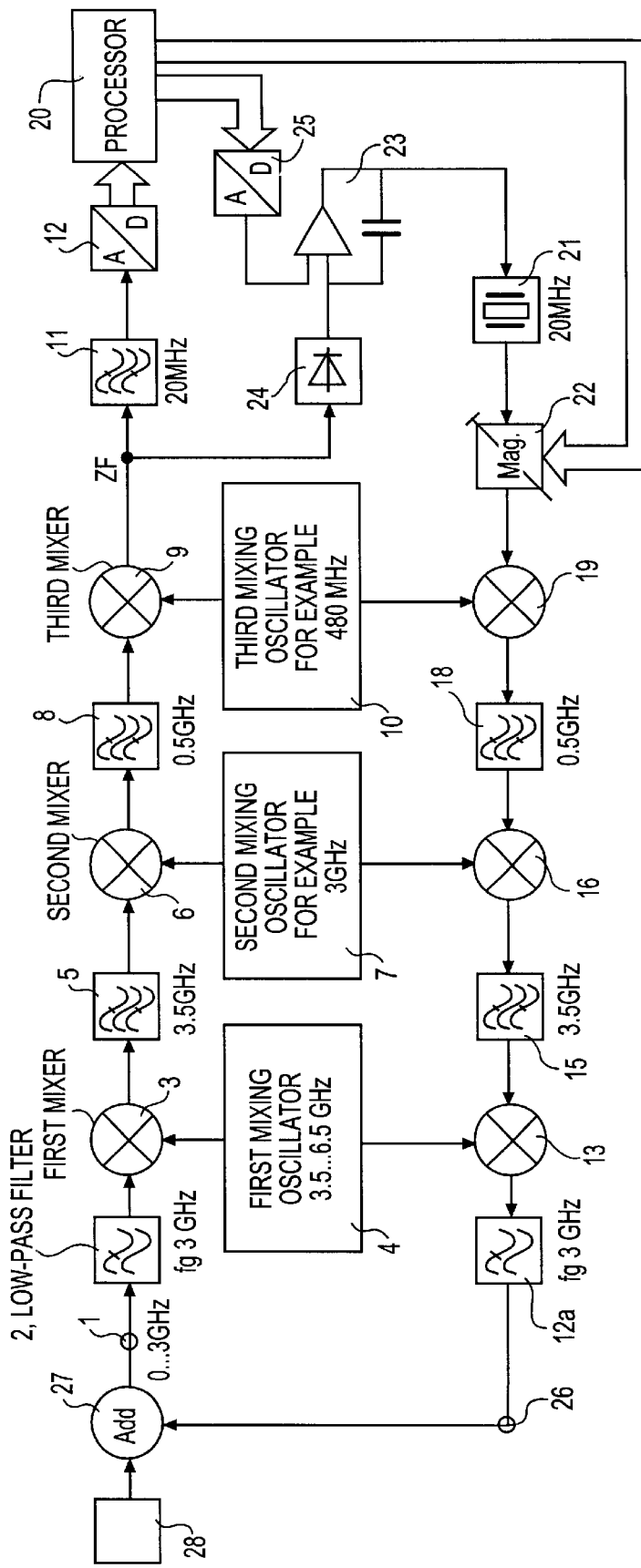
FIG. 1 shows a circuit/block diagram of a conventional spectrum analyzer having triple frequency conversions in a measuring branch.

Following an input 1 of the measuring branch are a low-pass filter 2 and a first mixer 3, which converts an input signal into a first intermediate frequency (IF) using a first frequency-adjustable mixing, local, oscillator 4. This first IF is fed through an intermediate frequency band filter 5 to a second mixer 6 where it is converted to a second intermediate frequency by a second mixing oscillator 7 having a constant frequency. After passing through a further intermediate frequency filter 8, the second IF is fed to a third mixer 9, in which the second intermediate frequency signal is converted into an output intermediate frequency IF by a third mixing oscillator 10 of fixed frequency. This is filtered in a third intermediate frequency band filter 11 and fed to an analog-to-digital (A/D) converter 12, and a digitalized output signal is evaluated in a processor 20. A digital fourth output signal of the measuring branch which is sampled from the A/D converter is evaluated in the processor 20, for example with an FFT (Fast Fourier transform) algorithm as to frequency and level. In the shown embodiment with the frequency values given in the figure, the output IF is 20 MHz.

A compensation generator is constructed in parallel to this actual measuring branch of the spectrum analyzer, in the manner of a known tracking generator, including, in reverse order and serially-arranged, mixers 19, 16, and 13 with intermediate frequency filters 18, 15, and 12a connected between them. The mixers are again supplied by the same mixing oscillators 10, 7, and 4 of the measuring branch. An input oscillator 21 is at the input of this compensation generator, which is connected to the first mixer 19 via a level control member 22. The oscillator 21 can be relatively-inexpensively constructed to have very low noise. Its output frequency is normally the same as the output IF of the measuring branch, for example 20 MHz. The control element 22 is adjustable by the processor 20. The frequency or phase of the input oscillator 21 is regulated by an integrating control circuit 23 in dependence upon an output level of the output IF. The level of the output IF is rectified by a diode 24 and controlled to a predetermined level value, to a level specified via the processor 20 which is converted by a digital-to-analog (D/A) converter 25, as described in more detail below.

The output signal of the compensation is fed, at output 26, to an adder stage 27 and, indeed, together with an output signal of a test specimen 28 to be measured for phase noise, with a sum signal at an output of the adder 27 being fed to the input 1 of the measuring branch.

In the shown structure the 20 MHz frequency of the input oscillator 21 in the compensation generator is successively mixed with all local oscillators, thereby creating an output signal which corresponds to a momentarily set received frequency of the measuring branch, that is which corresponds to the output frequency of the test specimen 28. The level of the output signal of the compensation generator is adjusted via the control element 22 such that it agrees with the level of the measurement signal of the test specimen 28. The filters in the compensation generator branch assure that only one signal is generated and that unwanted image frequencies are filtered out.

The output signal of the diode 24 is a measure of phase displacement between the frequency of the compensation generator and the output frequency of the test specimen 28. The frequency or phase of the input oscillator 21 is regulated by the integrator control circuit 23 such that the level of the output IF agrees with the level specified by the D/A converter 25. This regulation functions only up to a certain level, at greater level of suppression there would be no output IF signal available to control. A suppression of approximately 20 to 30 dB of the carrier in the measuring branch generally suffices for measurement. It is thus sufficient to specify, via the processor 20 and the D/A converter 25, a level of approximately −30 dB. Since the suppression also depends, of course, on amplitude equality of the two signals added in the adder 27, it is necessary to adjust the level of the compensation generator as precisely as possible using the control element 22.

In the arrangement of this invention, the compensation signal of the compensation generator having the same level and oppositely phased is thusly fed to the signal to be measured of the test specimen 28, to whose frequency the measuring branch of the spectrum analyzer is adjusted; because of the relative phase displacement between the two signals, the carrier can be strongly suppressed, and the sum signal contains only a small carrier remainder and sideband noise of the test specimen. The compensation generator supplies no sideband noise, since it gives off noise correlated to that of the measuring branch of the spectrum analyzer. Due to the low level of the carrier remainder, the mixing oscillators of the spectrum analyzer likewise transmit no appreciable contribution to the mixed IF signal at the output. Essentially, only the phase noise of the input signal is mixed on the output IF, which can be measured there as noise-power density. Prerequisite is only still a sufficiently low noise level of the spectrum analyzer, no longer a possible display dynamic. The actual measurement is performed most quickly, in a known manner with aid of an FFT. The phase signal-to-noise ratio is determined from the difference between the level of the input signal without compensation, which is measured with the compensation generator shut off, and the noise-power density, which is measured with a more sensitive adjustment and a suppressed carrier.

In many cases, measurement of the phase noise is desired at a greater interval from the carrier, for example at an interval of ±5 MHz. This is easily made possible by the output frequency of the compensation generator compared to the output frequency of the test specimen 28 being correspondingly displaced. This can be achieved by appropriate adjustment of the input oscillator 21 of the compensation generator. If this is adjusted to 30 MHz, for example, and the actual spectrum analyzer is adjusted to an input frequency that is 10 MHz lower than the output signal of the test specimen 28 to be measured, the phase noise is thus transmitted in the described sideward displacement from the carrier. It is only important that the diode 24 be sufficiently broadbanded to then measure the signal at 30 MHz.

What is claimed is:

1. Arrangement for the measurement of phase noise of an output signal of a test specimen (28) using a spectrum analyzer whose measuring branch comprises a plurality of serially connected heterodyne stages, each having a respective mixer (3, 6, 9), a mixing oscillator (4, 7, 10), and an intermediate frequency filter (5, 8, 11), wherein a compensation generator is comprised of a plurality of serially connected heterodyne stages (10, 18, 19; 7, 15, 16; 4, 12a, 13) arranged in reverse order to the heterodyne stages of the measuring branch, and having an input oscillator (21) which corresponds to a last intermediate frequency of the measuring branch said heterodyne stages (10, 18, 19; 7, 15, 16; 4, 12a, 13) of said compensation generator each comprising a respective mixer (13, 16, 19) and an intermediate frequency filter (12a, 15, 18), with said mixers (13, 16, 19) of the compensation generator being respectively supplied by said mixing oscillators (4, 7, 10) of said measuring branch, and wherein an output signal of said compensation generator is added to the output signal of the test specimen (28), with an approximately equal value level and being approximately oppositely phased thereto, in an adder stage (27) serially connected to an input (1) of the measuring branch.

2. Arrangement as in claim 1, wherein is further included a central element (22) for adjusting the level of the output signal of the compensation generator, which is fed to the adder stage (27), in dependence on an output level of the measuring branch to an equal-value level of the level of an output signal of the test specimen (28).

3. Arrangement as in claim 1, wherein is further included a control circuit (23, 24, 25) for regulating the frequency of the input oscillator of the compensation generator in dependence on the output level of the measuring branch to, in turn, cause the output level of the measuring branch to be in a predetermined value range.

4. Arrangement as in claim 1, wherein the frequency of the input oscillator (21) of the compensation generator is adjustable.

\* \* \* \* \*